United States Patent
Huang et al.

(10) Patent No.: US 6,239,024 B1
(45) Date of Patent: May 29, 2001

(54) METHOD OF FILLING GAP WITH DIELECTRICS

(75) Inventors: Chien-Chung Huang, Taichung Hsien;
Huang-Hui Wu, Changhua Hsien;
Yu-Tai Tsai, Taichung Hsien;
Yeong-Chih Lai, Nantou, all of (TW)

(73) Assignee: United Microelectronics Corp. (TW)

( * ) Notice: Subject to any disclaimer, the term of this patent is extended or adjusted under 35 U.S.C. 154(b) by 0 days.

(21) Appl. No.: 09/263,425

(22) Filed: Mar. 5, 1999

(51) Int. Cl.[7] .................................................. H01L 21/469
(52) U.S. Cl. ........................ 438/634; 438/624; 438/783
(58) Field of Search .................................. 438/634, 624, 438/783, 597, 633, 636, 637, 723, 945, 424, 695, 759, 427, 435; 427/579, 255, 221

(56) References Cited

U.S. PATENT DOCUMENTS

| | | | |
|---|---|---|---|
| 4,940,505 | * 7/1990 | Schachameyer et al. | 156/612 |
| 5,494,854 | * 2/1996 | Jain | 437/195 |
| 6,008,120 | * 12/1999 | Lee | 438/634 |
| 6,030,881 | * 2/2000 | Papsouliotis et al. | 438/424 |
| 6,037,018 | * 3/2000 | Jang et al. | 427/579 |

\* cited by examiner

Primary Examiner—Chandra Chaudhari
Assistant Examiner—Laura M. Schillinger
(74) Attorney, Agent, or Firm—Blakely Sokoloff Taylor & Zafman

(57) ABSTRACT

An improved method of forming an inter-metal dielectric layer on a semiconductor substrate is described. A plurality of conductive lines is formed on the substrate wherein an gap is simultaneously formed between every two conductive lines to expose a part of the substrate. A conformal first dielectric layer is formed on the plurality of conductive lines and the exposed substrate. A spin-coating material layer is formed in the gap wherein the first dielectric layer on top of the plurality of conductive lines is exposed. A plasma treatment is performed on the exposed first dielectric layer. The remaining spin-coating material layer is removed until the first dielectric layer is exposed. A second dielectric layer is formed over the first dielectric layer.

22 Claims, 3 Drawing Sheets

METHOD OF FILLING GAP WITH DIELECTRICS

BACKGROUND OF THE INVENTION

1. Field of Invention

The present invention relates to a semiconductor process. More particularly, the present invention relates to an improved method of filling gap with dielectrics.

2. Description of Related Art

With the increasing integration in integrated circuits (IC), a conventional wafer can no longer provide sufficient area for interconnects. In order to satisfy performance requirements, design rules of forming more than two metal layers for interconnects are gradually applied in integrated circuits. An inter-metal dielectric (IMD) layer is formed between two metal layers for isolation. Since a metal layer and a dielectric layer are alternately laminated to form metal interconnects, planarization and quality of the dielectric layer play an important role in semiconductor fabrication. If the result of the planarization is not ideal, the uneven surface of the dielectric layer causes misalignment when a subsequent photolithography process is performed so that the pattern cannot accurately transfer onto the metal line and the process becomes more difficult.

As device integration is increased, density of conductive lines is also increased. A gap is formed between every two neighboring conductive lines. While depositing a dielectric film of silicon oxide in a region with a high patterned density of the conductive lines, depositing rates on top of the conductive line, on sidewalls of the gap, and on the bottom of the gap are all different. Thus voids are easily generated in the silicon oxide layer. Voids in the silicon oxide layer seriously affect the device quality. While subsequently performing a chemical-mechanical polishing (CMP) step to planarize the silicon oxide layer, the voids are exposed so that slurry easily flows into these voids. Consequently, it is difficult to clean the slurry in the voids, which leads to contamination of the dielectrics. Device yield is thus decreased.

In order to solve aforementioned problems, a conventional method provides a nitrogen plasma treatment. However, the nitrogen plasma treatment needs one additional photomask and photoresist step so as to increase capital expenditure.

SUMMARY OF THE INVENTION

The invention provides an improved method of forming an inter-metal dielectric layer on a semiconductor substrate. A plurality of conductive lines is formed on the substrate wherein a gap is simultaneously formed between every two conductive lines to expose a part of the substrate. A conformal pad oxide layer is formed on the plurality of conductive lines and the exposed substrate. A spin-coating material layer is formed over the pad oxide layer. The spin-coating material layer is partially etched back to expose a portion of the pad oxide layer on top of the plurality of conductive lines wherein the remaining spin-coating material layer covers a part of the pad oxide layer at the bottoms and on sidewalls of the gaps. A plasma treatment is performed on the exposed pad oxide layer. The remaining spin-coating material layer is removed until the pad oxide layer is exposed. A first dielectric layer is formed over the pad oxide layer.

One advantage of the invention is that the nitrogen plasma treatment is just selectively performed in a region where overhang easily occurs at top corners of the conductive lines.

Moreover, another advantage of the invention is that the subsequent plasma can be performed in a self-aligned process. An additional photomask is not needed so as to save capital expenditure.

The invention can prevent overhang occurring on top corners of the conductive lines. Voids generated in a subsequently formed dielectric layer are avoided, and a dielectric layer with no voids can be formed. Thus, a gap filling ability of the dielectric layer is efficiently improved.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1A:
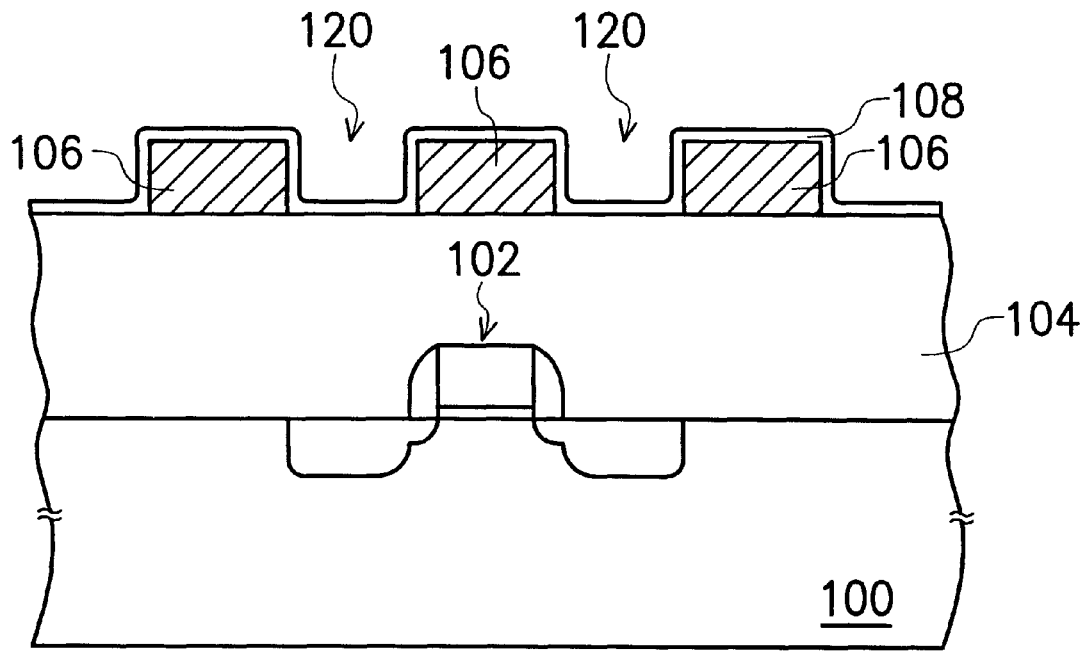
FIGS. 1A through 1D are schematic, cross-sectional views showing a method for forming an inter-metal dielectric layer according to one preferred embodiment of this invention.

Reference will now be made in detail to the present preferred embodiments of the invention, examples of which are illustrated in the accompanying drawings. Wherever possible, the same reference numbers are used in the drawings and the description to refer to the same or like parts.

FIGS. 1A through 1D are schematic, cross-sectional views showing a method for forming an inter-metal dielectric layer according to one preferred embodiment of this invention.

Referring to FIG. 1A, a semiconductor substrate 100 such as a silicate substrate is provided. A metal oxide semiconductor (MOS) transistor 102 is formed on the substrate 100. At least one dielectric layer 104 is formed on the substrate 100 to cover the MOS transistor 102. A plurality of patterned conductive lines 106 is formed on the dielectric layer 104. On the dielectric layer 104, there is a region with a higher patterned density of the conductive lines 106, as seen in figures. Additionally, there is still another region with a lower patterned density of the conductive lines 106 on the dielectric layer 104, which region is not shown in the figures. The conductive lines 106 includes, for example, metal, and are preferably made of copper, aluminum, or aluminum-copper alloy. The method of forming the patterned conductive lines 106 includes, for example, forming a conductive layer on the dielectric layer 104, then defining the conductive layer by photolithography and etching. At this time, a gap 120 is formed between every two neighboring conductive lines 106 to expose a portion of the dielectric layer 104. A conformal pad oxide layer 108 is formed on the conductive lines 106 and a portion of the dielectric layer 104 exposed by the gap 120. The conformal pad oxide layer 108 is formed by, for example, plasma-enhanced chemical vapor deposition (PECVD). The conductive lines 106 are directly covered with the pad oxide layer 108 in order to increase adhesion and isolation.

Figure 1B:
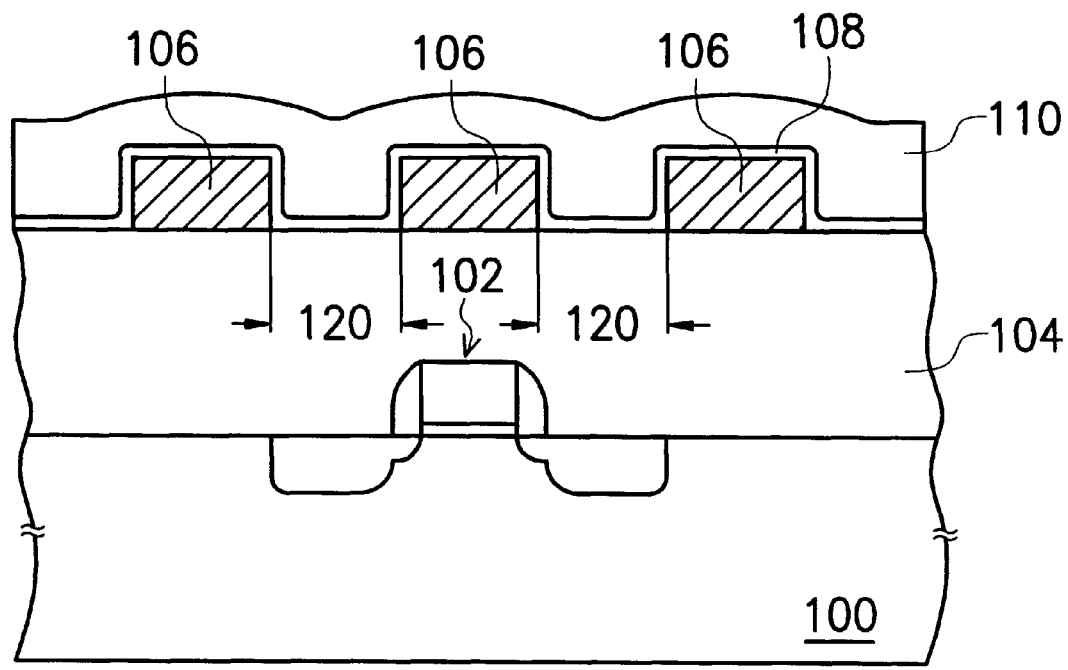

Referring to FIG. 1B, a spin-coating material layer 110 is formed to fill the gaps 120 and cover the pad oxide layer 108. The spin-coating material layer 110 includes, for example, spin-on glass (SOG), spin-on-polymer (SOP), or other flowable material. The spin-coating material layer 110 is formed by, for example, spin coating.

Figure 1C:
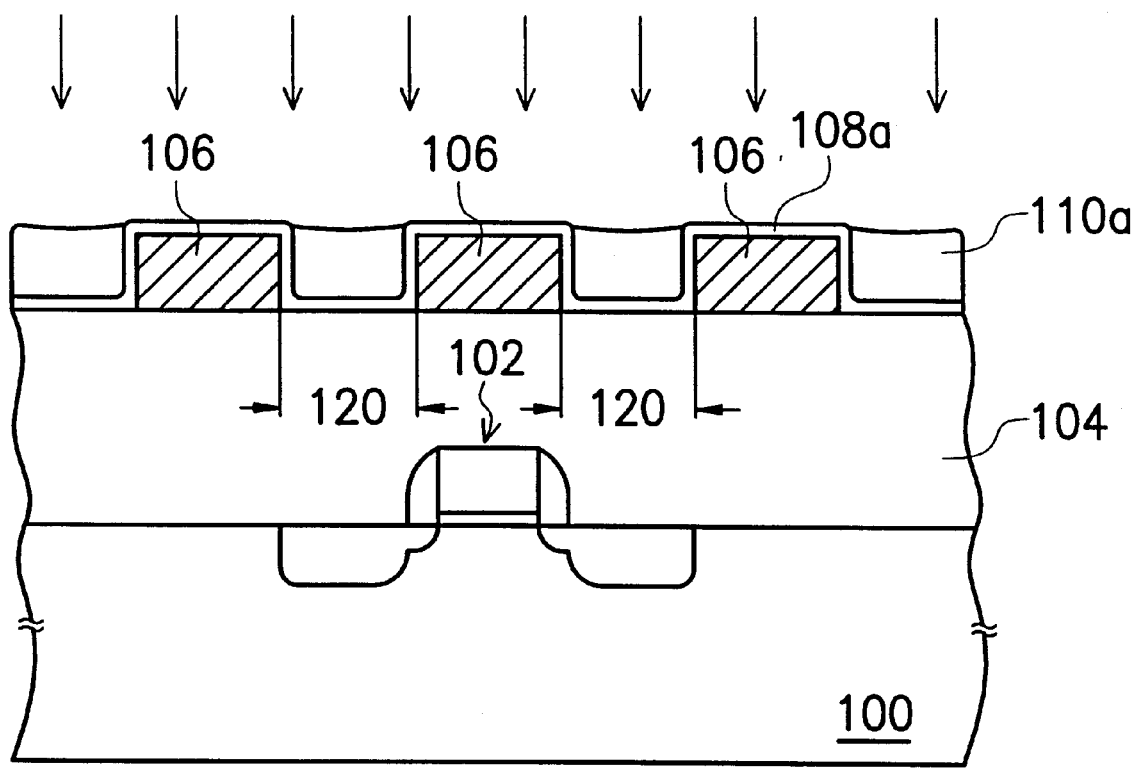

Referring to FIG. 1C, the spin-coating material layer 110 is partially etched back to expose portions of the pad oxide layer 108 on top of the conductive lines 106 with a higher patterned density. Thus, the remaining spin-coating material layer 110 (FIG. 1B) forms a spin-coating material layer 110a. At this time, the spin-coating material layer 110a covers a part of the pad oxide layer 108 at the bottoms and on sidewalls of the gaps 120. A plasma treatment is performed on the substrate 100 to change the property of the exposed pad oxide layer 108a on top of the conductive lines 106. Here, through the plasma process, a part of the pad oxide layer 108 forms a pad oxide layer 108a. The plasma treatment is performed, for example, using nitrogen gas ($N_2$) as a plasma gas source. The flow rate of nitrogen gas is approximately form 400 to 600 sccm. The pressure of the process is controlled at approximately form 1 to 5 torr. The duration of the plasma process is approximately form 25 to 50 seconds.

Since the spin-coated material layer 110 (FIG. 1B) on top of the conductive lines 106 is thinner in the high patterned density region, the spin-coating material layer 110 (FIG. 1B) is easily partially etched back to expose a part of the pad oxide layer 108 on the conductive lines 106. The remaining spin-coating material layer 110a still covers the sidewalls and the bottom of the gap 120 between the neighboring conductive lines 106. Therefore, the subsequent plasma treatment can be performed in a self-aligned process. An additional photomask is not needed so as to save capital expenditure.

Additionally, after the aforementioned partial etching back process is performed in the region with a high patterned density of the conductive lines 106, some spin-coating material may remain on the conductive lines 106 in the region (not shown in figures) with a lower patterned density. Because voids are not easily generated in the gaps 120 between the neighboring conductive lines 106 in this low patterned density region, the etching back process is not necessarily performed in the region with a low patterned density of the conductive lines 106. Therefore, the invention just selectively performs the plasma treatment in a region where overhang easily occurs at top corners of the conductive lines. Overhang causes voids generated in the gaps 120 between the neighboring conductive lines 106.

Figure 1D:
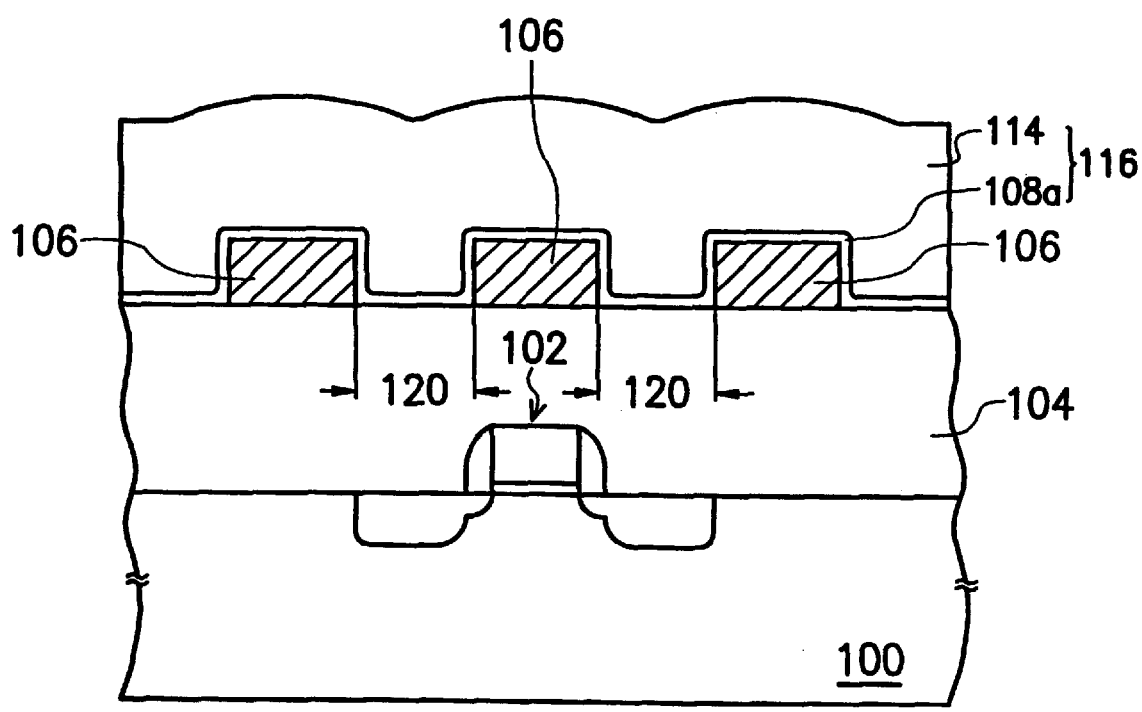

Referring to FIG. 1D, the remaining spin-coating material layer 110a is removed until the pad oxide layer 108a is exposed. The removal method includes, for example, performing a wet etching with a buffer solution of hydrofluoric acid (HF) and $NH_4F$ serving as an etchant wherein the buffer solution comprises a composition ratio about 10:1 of HF:$NH_4F$. The buffer solution has a high etching selectivity (lager than 40) compared to the spin-coating material layer 108a and the pad oxide layer 108a. A thick dielectric layer 114 is formed over the pad oxide layer 108a. The dielectric layer 114 includes, for example, silicon oxide. The dielectric layer 114 formation includes performing chemical vapor deposition using a sufficiently good step coverage ability gas such as a mixture of ozone ($O_3$) and tetra-ethyl-ortho-silicate (TEOS) as a reacting gas. The pad oxide layer 108a and the dielectric layer 114 form an inter-metal dielectric layer 116.

The property of the pad oxide layer 108a is changed due to the plasma process so that the depositing rate for silicon oxide on top of the conductive line 106 is lowered. Thus, for silicon oxide, the depositing rate on top of the conductive line 106 is slower than that on the bottom and sidewalls of the gap 120. Consequently, the invention can prevent overhang occurring on top corners of the conductive lines 106. Voids generated in the dielectric layer 114 can also be avoided, and a dielectric layer 114 with no voids can be formed. Thus, a gap filling ability of the dielectric layer is efficiently improved.

In the invention, the spin-coating material layer 110 (FIG. 1B) is partially etched back to expose the pad oxide layer 108 (FIG. 1B) on top of the conductive layers 106, and then to perform a plasma treatment with nitrogen gas on the exposed pad oxide layer 108. After the nitrogen plasma treatment, the remaining spin-coating material layer 110a (FIG. 1C) is removed. This method can prevent voids from being generated in the dielectric layer 114 (FIG. 1D) due to different depositing rates. Therefore, when a via hole is formed in the dielectric layer 114 in a later process, a poisoned via caused by voids is also avoided. Thus, while fabricating an interconnect to form a via hole in the dielectric layer, the via hole is easily filled with a conductive material layer to form a via plug, and the via plug is successfully electrically connected with the conductive line 106. An unexpected open circuit, as often seen in the conventional art, also does not occur.

The invention can be used to fabricate a dielectric film in any one kind of semiconductor devices.

One advantage of the invention is that the nitrogen plasma treatment is just selectively performed in a region where overhang easily occurs at top corners of the conductive lines to cause voids generated in the gaps between the neighboring conductive lines.

While performing the partial etching back process, the spin-coating material layer on the conductive lines is thinner in the high patterned density region, hence the spin-coating material layer is easily partially etched back to expose the pad oxide layer on the conductive lines. The remaining spin-coating material layer still covers the pad oxide layer on sidewalls and at the bottom of the gap between the neighboring conductive lines. Therefore, another advantage of the invention is that the subsequent plasma can be performed in a self-aligned process. An additional photomask is not needed so as to save capital expenditure.

Additionally, the invention forms a spin-coating material layer over the substrate, then partially etches back the spin-coating layer to expose the pad oxide layer on the conductive line. Then, a nitrogen plasma process is performed to change the property of the exposed pad oxide layer on the conductive line.

Through the nitrogen plasma treatment, the property of the exposed pad oxide layer on the conductive layer is changed. Since the pad oxide layer on sidewalls and at the bottom of the gap between the neighboring conductive lines is covered with the remaining spin-coating material layer, property of this part of the pad oxide layer is not changed. Consequently while subsequently depositing silicon oxide with $O_3$ and TEOS serving as a reacting gas, the depositing rate of the fore is slower than the depositing rate for the latter. Therefore, the invention can prevent overhang occurring on top corners of the conductive lines. Voids generated in a subsequently formed dielectric layer are avoided, and the dielectric layer with no voids can be formed. Thus, a gap filling ability of the dielectric layer is efficiently improved.

The invention can prevent voids in the dielectric layer. When a via hole is formed in the dielectric layer in a later process, a poisoned via caused by voids is also avoided.

Thus, while fabricating an interconnect, a via hole is easily filled with a conductive material layer to form a via plug, and the via plug is successfully electrically connected with the conductive line. An unexpected open circuit does not also occur.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. An improved method of forming an inter-metal dielectric layer on a semiconductor substrate, comprising:

forming a plurality of conductive lines on the substrate wherein a gap is simultaneously formed between every two conductive lines to expose a part of the substrate;

forming a conformal pad oxide layer on the plurality of conductive lines and the exposed substrate;

forming a spin-coating material layer over the pad oxide layer;

partially etching back the spin-coating material layer to expose a portion of the pad oxide layer on top of the plurality of conductive lines wherein the remaining spin-coating material layer covers a part of the pad oxide layer at bottoms and on sidewalls of the gaps;

performing a plasma treatment on the exposed pad oxide layer;

removing the remaining spin-coating material layer until the pad oxide layer is exposed; and forming a first dielectric layer over the pad oxide layer.

2. The method according to claim 1, wherein the pad oxide layer is formed by plasma enhanced chemical vapor deposition (PECVD).

3. The method according to claim 1, wherein the dielectric layer is formed by chemical vapor deposition with ozone ($O_3$) and tetra-ethyl-ortho-silicate (TEOS) serving as a reacting gas.

4. The method according to claim 1, wherein the plasma treatment comprises using nitrogen gas as a plasma gas source.

5. The method according to claim 4, wherein a flow rate of nitrogen gas is approximately from 400 to 600 sccm.

6. The method according to claim 4, wherein a pressure of the plasma process is controlled at approximately from 1 to 5 torr.

7. The method according to claim 4, wherein a duration of the plasma process is approximately from 25 to 50 seconds.

8. The method according to claim 1, wherein the spin-coating material layer is chosen from a group consisting of spin-on-glass, and spin-on-polymer.

9. The method according to claim 1, wherein the substrate comprises a metal oxide semiconductor (MOS) transistor and a second dielectric layer formed thereon.

10. The method according to claim 1, wherein the remaining spin-coating material layer is removed by wet etching.

11. The method according to claim 10, wherein the wet etching step comprises using a buffer solution of hydrofluoric acid (HF) and $NH_4F$ with a composition ratio about 10:1 of $HF:NH_4F$.

12. An improved method of forming an inter-metal dielectric layer on a semiconductor substrate, comprising:

forming a plurality of conductive lines on the substrate wherein an gap is simultaneously formed between every two conductive lines to expose a part of the substrate;

forming a conformal first dielectric layer on the plurality of conductive lines and the exposed substrate;

forming a spin-coating material layer in the gap wherein the first dielectric layer on top of the plurality of conductive lines is exposed, and the spin-coating material laver covers a part of the first dielectric layer at bottoms and sidewalls of the gaps;

performing a plasma treatment on the exposed first dielectric layer;

removing the remaining spin-coating material layer until the first dielectric layer is exposed; and forming a second dielectric layer over the first dielectric layer.

13. The method according to claim 12, wherein the first dielectric layer is formed by plasma enhanced chemical vapor deposition (PECVD).

14. The method according to claim 12, wherein the second dielectric layer is formed by chemical vapor deposition with ozone ($O_3$) and tetra-ethyl-ortho-silicate (TEOS) serving as a reacting gas.

15. The method according to claim 12, wherein the plasma treatment comprises using nitrogen gas as a plasma gas source.

16. The method according to claim 15, wherein a flow rate of nitrogen gas is approximately from 400 to 600 sccm.

17. The method according to claim 15, wherein a pressure of the plasma process is controlled at approximately from 1 to 5 torr.

18. The method according to claim 15, wherein a duration of the plasma process is approximately from 25 to 50 seconds.

19. The method according to claim 12, wherein the spin-coating material layer is chosen from a group consisting of spin-on-glass and spin-on-polymer.

20. The method according to claim 12, wherein the spin-coating material layer is removed by wet etching.

21. The method according to claim 20, wherein the wet etching step comprises using a buffer solution of hydrofluoric acid (HF) and $NH_4F$ with a composition ratio about 10:1 for $HF:NH_4F$.

22. The method according to claim 12, wherein the substrate comprises a metal oxide semiconductor (MOS) transistor and a second dielectric layer formed thereon.

* * * * *

UNITED STATES PATENT AND TRADEMARK OFFICE
CERTIFICATE OF CORRECTION

PATENT NO.       : 6,239,024 B1
APPLICATION NO. : 09/263425
DATED            : May 29, 2001
INVENTOR(S)      : Huang et al.

It is certified that error appears in the above-identified patent and that said Letters Patent is hereby corrected as shown below:

On Title Page,
Item [75] Inventors, after "Nantou", please insert --Hsien--.

Col. 6, line 17,
Please delete "laver" and insert --layer--.

Signed and Sealed this

Thirtieth Day of January, 2007

JON W. DUDAS
*Director of the United States Patent and Trademark Office*